US006872322B1

United States Patent
Chow et al.

(10) Patent No.: US 6,872,322 B1
(45) Date of Patent: Mar. 29, 2005

(54) MULTIPLE STAGE PROCESS FOR CLEANING PROCESS CHAMBERS

(75) Inventors: Waiching Chow, Fremont, CA (US); Raney Williams, Portland, OR (US); Thorsten B. Lill, Sunnyvale, CA (US); Arthur Y. Chen, Fremont, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/362,924

(22) Filed: Jul. 27, 1999

Related U.S. Application Data (63) Continuation-in-part of application No. 08/969,122, filed on Nov. 12, 1997, now Pat. No. 6,136,211.

(51) Int. Cl.[7] .............................................. H01L 21/48
(52) U.S. Cl. ........................... 216/67; 216/75; 216/79; 134/1.1; 134/21; 134/22; 134/2.6; 438/710; 438/721; 438/723
(58) Field of Search ........................... 216/37, 67, 75, 216/79; 438/710, 721, 723; 134/1.1, 21, 22.1, 26

(56) References Cited

U.S. PATENT DOCUMENTS

| 4,282,267 A | 8/1981 | Kuyel .......................... 427/38 |
| 4,433,228 A | 2/1984 | Nishimatsu et al. .. 219/10.55 R |
| 4,465,532 A | 8/1984 | Fukano ........................ 156/643 |
| 4,490,209 A | 12/1984 | Hartman ...................... 156/643 |
| 4,502,914 A | 3/1985 | Trumpp et al. .............. 156/643 |

(Continued)

FOREIGN PATENT DOCUMENTS

| DE | 4132559 | 4/1993 |
| EP | 0200951 | 4/1986 |
| EP | 0272143 | 6/1988 |
| EP | 0314990 | 5/1989 |
| EP | 0463373 | 1/1992 |
| EP | 0516043 | 12/1992 |
| EP | 0555546 | 8/1993 |
| EP | 0697467 | 2/1996 |
| EP | 0709877 | 5/1996 |
| EP | 0746015 | 12/1996 |
| EP | 0837497 | 4/1998 |
| JP | 01050427 | 2/1989 |
| JP | 6177092 | 6/1994 |
| JP | 7029879 | 1/1995 |
| JP | 1023387 | 9/1998 |
| WO | 9615545 | 5/1996 |

OTHER PUBLICATIONS

Kimizuka, Masakatsu et al. "Pattern Profile Control in Magnetron reactive ion etching of Poly–Si" J. Vac. Sci Technol. B 10(5), Sep./Oct. 1992. pp. 2192–2196.

(Continued)

Primary Examiner—Shrive P. Beck
Assistant Examiner—Allan Olsen
(74) Attorney, Agent, or Firm—Ashok K. Janah; Joseph Bach (57) ABSTRACT

A process for etching multiple layers on a substrate 25 in an etching chamber 30 and cleaning a multilayer etchant residue formed on the surfaces of the walls 45 and components of the etching chamber 30. In multiple etching steps, process gas comprising different compositions of etchant gas is used to etch layers on the substrate 25 thereby depositing a compositionally variant etchant residue inside the chamber 30. In one cleaning step, a first cleaning gas is added to the process gas to clean a first residue or to suppress deposition of the first residue onto the chamber surfaces. In a second cleaning step, another residue composition is cleaned off the chamber surfaces using a second cleaning gas composition.

40 Claims, 6 Drawing Sheets

U.S. PATENT DOCUMENTS

| | | | |
|---|---|---|---|
| 4,576,692 A | 3/1986 | Fukuta et al. | 204/165 |
| 4,705,595 A | 11/1987 | Okudaira et al. | 156/643 |
| 4,738,748 A | 4/1988 | Kisa | 156/643 |
| 4,779,991 A | 10/1988 | Kitamura et al. | 438/719 |
| 4,786,352 A | 11/1988 | Benzing | 156/345 |
| 4,818,326 A | 4/1989 | Liu et al. | 156/345 |
| 4,831,963 A | 5/1989 | Saito et al. | 118/723 |
| 4,863,561 A | 9/1989 | Freeman et al. | 156/646 |
| 4,867,841 A | 9/1989 | Loewenstein et al. | 156/643 |
| 4,876,212 A | 10/1989 | Koury | 437/34 |
| 4,975,144 A | 12/1990 | Yamazaki et al. | 156/643 |
| 4,992,134 A | 2/1991 | Gupta et al. | 156/628 |
| 4,992,136 A | 2/1991 | Tachi et al. | 156/643 |
| 4,994,410 A | 2/1991 | Sun et al. | 437/192 |
| 5,002,632 A | 3/1991 | Loewenstein et al. | 156/643 |
| 5,013,398 A | 5/1991 | Long et al. | 156/643 |
| 5,035,768 A | 7/1991 | Mu et al. | 156/626 |
| 5,084,126 A | 1/1992 | McKee | 156/345 |
| 5,094,712 A | 3/1992 | Becker et al. | 156/643 |
| 5,110,408 A | 5/1992 | Fujii et al. | 156/643 |
| 5,110,411 A | 5/1992 | Long | 156/656 |
| 5,118,387 A | 6/1992 | Kadomura | 156/657 |
| 5,158,644 A | 10/1992 | Cheung et al. | 156/643 |
| 5,160,407 A | 11/1992 | Latchford et al. | 156/656 |
| 5,164,330 A | 11/1992 | Davis et al. | 437/192 |
| 5,176,792 A | 1/1993 | Fullowan et al. | 156/652 |
| 5,180,464 A * | 1/1993 | Tatsumi et al. | 156/626 |
| 5,188,980 A | 2/1993 | Lai | 437/193 |
| 5,192,702 A | 3/1993 | Tseng | 437/47 |
| 5,256,245 A | 10/1993 | Keller et al. | 156/643 |
| 5,259,923 A | 11/1993 | Hori et al. | 156/643 |
| 5,281,302 A | 1/1994 | Gabric et al. | 156/643 |
| 5,282,899 A | 2/1994 | Balmashnov et al. | 118/723 R |
| 5,312,519 A | 5/1994 | Sakai et al. | 134/1 |
| 5,318,668 A | 6/1994 | Tamaki et al. | 156/662 |
| 5,338,398 A | 8/1994 | Szwejkowski et al. | 156/655 |
| 5,354,417 A | 10/1994 | Cheung et al. | 156/643 |
| 5,356,478 A | 10/1994 | Chen et al. | 134/1 |
| 5,358,601 A | 10/1994 | Cathey | 156/656 |
| 5,378,311 A | 1/1995 | Nagayama et al. | 156/643 |
| 5,382,316 A | 1/1995 | Hills et al. | 156/643 |
| 5,384,009 A | 1/1995 | Mak et al. | 156/662 |
| 5,413,954 A | 5/1995 | Aydil et al. | 437/81 |
| 5,431,772 A | 7/1995 | Babie et al. | 156/643.1 |
| 5,443,686 A | 8/1995 | Jones et al. | 216/37 |
| 5,449,411 A | 9/1995 | Fukuda et al. | 118/723 MP |
| 5,514,622 A | 5/1996 | Bornstein et al. | 437/189 |
| 5,521,119 A | 5/1996 | Chen et al. | 437/187 |
| 5,529,197 A | 6/1996 | Grewal | 216/68 |
| 5,605,601 A | 2/1997 | Kawasaki | 156/643.1 |
| 5,620,615 A | 4/1997 | Keller | 438/720 |
| 5,626,775 A | 5/1997 | Roberts et al. | 216/67 |
| 5,644,153 A | 7/1997 | Keller | 257/324 |
| 5,651,856 A | 7/1997 | Keller et al. | |
| 5,700,741 A | 12/1997 | Liao | 438/723 |
| 5,716,495 A | 2/1998 | Butterbaugh et al. | 156/643.1 |
| 5,741,396 A | 4/1998 | Loewenstein | |
| 5,753,533 A | 5/1998 | Saito | 437/192 |
| 5,756,400 A | 5/1998 | Ye et al. | 438/710 |
| 5,767,021 A | 6/1998 | Imai et al. | 438/219 |
| 5,788,799 A | 8/1998 | Steger et al. | 156/345 |
| 5,817,534 A * | 10/1998 | Ye et al. | 438/10 |
| 5,843,239 A | 12/1998 | Shrotriya | 134/1.1 |
| 5,861,233 A | 1/1999 | Sekine et al. | 430/296 |
| 5,865,896 A * | 2/1999 | Nowak et al. | 118/723 AN |
| 5,866,483 A | 2/1999 | Shiau et al. | 438/720 |
| 5,869,401 A | 2/1999 | Brunemeier et al. | 438/710 |
| 5,874,363 A | 2/1999 | Hoh et al. | 438/721 |
| 5,879,575 A | 3/1999 | Tepman et al. | 216/68 |
| 5,891,799 A * | 4/1999 | Tsui | 438/624 |
| 6,090,718 A | 7/2000 | Soga et al. | 438/714 |
| 6,125,859 A | 10/2000 | Kao et al. | 134/1.1 |
| 6,159,811 A * | 12/2000 | Shin et al. | 438/303 |

OTHER PUBLICATIONS

Avdil. et al. "Multiple Steady States in a Radio Frequency Chlorine Glow Discharge." *J Appl. Phys.* vol. 69, No. 1, Jan. 1, 1991, pp. 109–114.

Hillenius. S.J. et al., "A Symmetric Submicron CMOS Technology." *IEEE* pp. 252–255, 1986.

PCT Notification of International Search Report dated Feb. 4, 1999.

PCT Search Report dated Oct. 28, 1999.

PCT International Preliminary Examination Report dated Feb. 14, 2000.

PCT Search Report dated Nov. 8, 2000.

PCT Report dated Jun. 22, 2001. European Patent Office. P.B. 5818 Patentlaan 2 N1.–2280 IIV Rijswijk.

Zaleski. et al "Jungsten Silicide/Polysilicon Stack Etching using Mixed Fluorine Chlorine Chemistry in a High Density Plasma Chamber". *Electrochemical Society Proceedings* vol. 98–4, pp. 203–209.

* cited by examiner

MULTIPLE STAGE PROCESS FOR CLEANING PROCESS CHAMBERS

CROSS-REFERENCE

This application is a continuation-in-part of application Ser. No. 08/969,122, filed Nov. 12, 1997, now U.S. Pat. No. 6,136,211 which is incorporated herein by reference.

BACKGROUND

The present invention relates to a method of cleaning chambers that are used in the processing of substrates.

In the manufacture of integrated circuits, materials such as silicon dioxide, silicon nitride, polysilicon, metal, metal silicide, and monocrystalline silicon, that are deposited or otherwise formed on a substrate, are etched in predefined patterns to form gates, vias, contact holes, trenches, and/or interconnect lines. In the etching process, a patterned mask composed of silicon oxide or silicon nitride (hard mask) or photoresist polymer, is formed on the substrate by conventional photolithographic methods. The exposed portions of the underlying material that lie between the features of the patterned mask are etched by capacitive or inductively coupled plasmas of etchant gas. During the etching processes, etchant residue (often referred to as a polymer) deposits on the walls and other component surfaces inside the etching chamber. The composition of the etchant residue (residue from the etch process) depends upon the chemical composition of vaporized species of etchant gas, the material being etched, and the mask layer on the substrate. For example, when tungsten silicide, polysilicon or other silicon-containing layers are etched, silicon-containing gaseous species are vaporized or sputtered from the substrate; similarly, etching of metal layers results in vaporization of metal species. In addition, the mask layer on the substrate is also partially vaporized by the etchant gas to form gaseous hydrocarbon or oxygen species. The vaporized and gaseous species condense to form etchant residue comprising polymeric byproducts composed of hydrocarbon species from the resist; gaseous elements such as fluorine, chlorine, oxygen, or nitrogen; and elemental silicon or metal species depending on the composition of the substrate being etched. The polymeric byproducts deposit as thin layers of etchant residue on the walls and components in the chamber. The composition of the etchant residue typically varies considerably across the chamber surface depending upon the composition of the localized gaseous environment, the location of gas inlet and exhaust ports, and the geometry of the chamber.

The compositional variant, non-homogeneous, etchant residue formed on the etching chamber surfaces has to be periodically cleaned to prevent contamination of the substrate. Typically, after processing of about 25 wafers, an in-situ plasma "dry-clean" process is performed in an empty etching chamber to clean the chamber. However, the energetic plasma species rapidly erode the chamber walls and chamber components, and it is expensive to replace these parts and components. Also, erosion of the chamber surfaces can result in instability of the etching process from one wafer to another. The relatively thin and compositionally variant etchant residue can also make it difficult to stop the in-situ plasma clean process immediately after all of the etchant residue is removed—which results in erosion of the underlying chamber surfaces. Also, it is difficult to clean-off the chemically hard residue deposited at portions of the chamber surfaces without entirely removing chemically softer residues at other portions of the chamber and eroding the underlying chamber surfaces. For example, the etchant residue formed near the chamber inlet or exhaust often has a higher concentration of etchant gas species than the residue formed near the substrate which typically contains a higher concentration of resist, hard mask, or of the material being etched.

It is difficult to form a cleaning plasma that uniformly etches away the compositionally different variants of etchant residue. Thus after cleaning of about 100 or 300 wafers, the etching chamber is opened to the atmosphere and cleaned in a "wet-cleaning" process, in which an operator uses an acid or solvent to scrub off and dissolve accumulated etchant residue from the chamber walls. To provide consistent chamber properties, after the wet cleaning step, the chamber and its internal surfaces are "seasoned" by pumping down the chamber for an extended period of time, and thereafter, performing a series of runs of the etch process on dummy wafers. The internal chamber surfaces should exhibit consistent chemical surfaces, i.e., surfaces having little or no variations in the concentration, type, or functionality of surface chemical groups; otherwise, the etching processes performed in the chamber produce varying etching results from one substrate to another. In the pump-down process, the chamber is pumped down to a high vacuum environment for 2 to 3 hours to outgas moisture and other volatile species trapped in the chamber during the wet clean process. Thereafter, the etch process to be performed in the chamber, is run for 10 to 15 minutes on a set of dummy wafers, or until the chamber provides consistent and reproducible etching properties.

In the competitive semiconductor industry, the increased cost per substrate that results from the downtime of the etching chamber during the dry or wet cleaning and seasoning process steps, is undesirable. It typically takes 5 to 10 minutes for each dry cleaning process step, and 2 to 3 hours to complete the wet cleaning processes. Also, the wet cleaning and seasoning process often provide inconsistent and variable etch properties. In particular, because the wet cleaning process is manually performed by an operator, it often varies from one session to another, resulting in variations in chamber surface properties and a low reproducibility of etching processes. Thus it is desirable to have an etching process that can remove or eliminate deposition of etchant residue on the chamber surfaces.

Figure 1A:
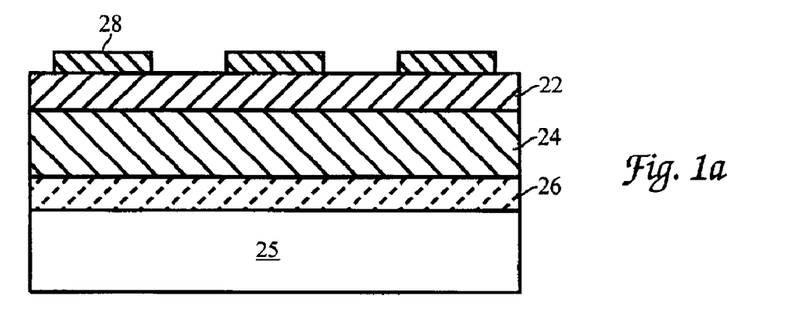
FIG. 1a is a schematic cross-section of a substrate having silicon dioxide, polysilicon, metal silicide and resist layers.
Figure 1B:
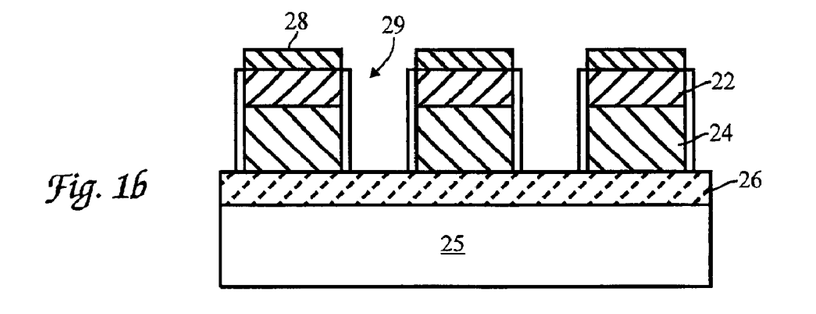
FIG. 1b is a schematic cross-section of the substrate of FIG. 1a after etching of the metal silicide and polysilicon layers.
Figure 1C:
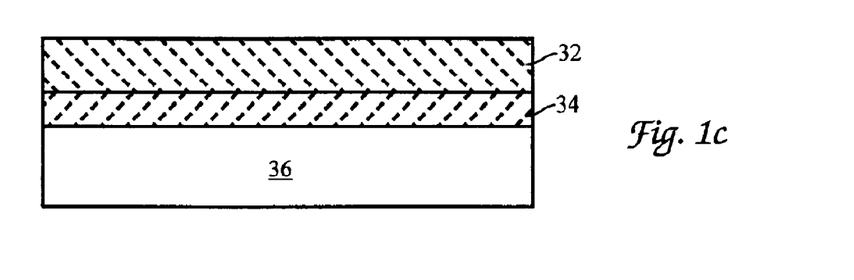
FIG. 1c is a schematic cross-section of a silicon or polysilicon substrate having a mask layer of silicon nitride.
Figure 1D:
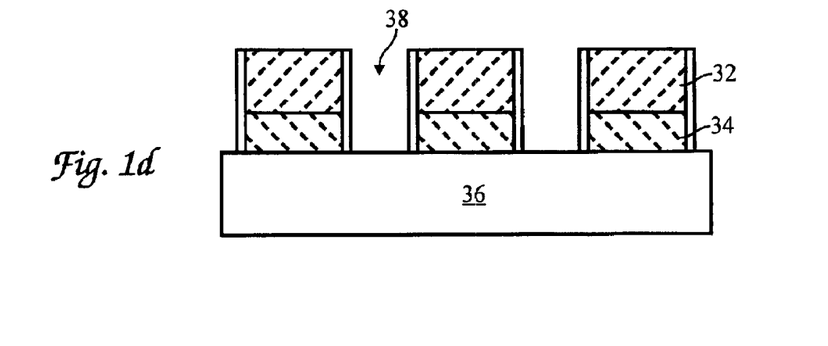
FIG. 1d is a schematic cross-section of the substrate of FIG. 1c after etching of trenches in the silicon or polysilicon.

In semiconductor fabrication, yet another type of problem arises in the etching of multiple layers of materials that have similar constituent elements, for example, silicon-containing materials such as tungsten silicide, polysilicon, silicon nitride, and silicon dioxide. With reference to FIGS. 1a and 1b, a typical multilayer polycide structure on a semiconductor substrate 25 comprises metal silicide layers 22 deposited over doped or undoped polysilicon layers 24. The polycide layers are formed over silicon dioxide layers 26 and etched to form the etched features 29. In these multilayer structures, it is difficult to obtain a high etching selectivity ratio for etching the metal silicide layer 22 relative to the overlying resist layer 28 or the underlying polysilicon layer 24. It is desirable to have a high etching selectivity ratio for etching polycide structures that have a non-planar and highly convoluted topography. At a certain time during the etching process, the thinner metal silicide layer 22 is etched through and etching of the underlying polysilicon layer 24 begins, while the thicker metal silicide layer 22 is still being etched. Thus, it is desirable to etch the metal silicide layer 22 at a faster rate relative to the rate of etching of the polysilicon layer 24, for example. The same problem arises in the etching of a mask layer of silicon nitride 32 on a very thin silicon dioxide layer 34, prior to forming trenches in a substrate comprising silicon 36, as for example shown in FIGS. 1c and 1d. The etched trenches 38 are used to isolate active MOSFET devices formed on the substrate. The etching selectivity ratio for etching silicon nitride relative to silicon dioxide has to be very high to stop on the silicon dioxide layer 34 without etching through the layer.

High etching selectivity ratios are obtained using a process gas composition that etches the different silicon-containing materials at significantly different etching rates which depend upon the chemical reactivity of the particular process gas composition with a particular layer. However, etching metal silicide layers with high selectivity to polysilicon, or etching silicon nitride layers with high selectivity to silicon dioxide layers, is particularly difficult because both materials contain elemental silicon and most conventional etchant plasmas etch the silicon containing layers to form gaseous $SiCl_x$ or $SiF_x$ species. Thus, it is difficult for the etchant plasma to chemically distinguish and preferentially etch the metal silicide layer 22 faster than the polysilicon layer 24, and the silicon nitride layer 32 faster than the silicon dioxide layer 34. This problem is further exacerbated because the etchant residue formed on the chamber sidewalls also contains silicon dioxide and attempts to remove the etchant residue during the polycide etching process can lower the etching rate or etching selectivity ratio for etching these layers.

Thus it is desirable to have an etch process that reduces formation of etchant residue in the etching chamber. It is also desirable if the etchant or cleaning gases do not to erode the exposed surfaces in the chamber. It is further desirable to have an etching or cleaning process that restores the original chemical reactivity and surface functional groups of the chamber surfaces. It is further desirable for the cleaning process to remove chemically adhered etchant residue layers having variable thickness and variant chemical compositions and reactivity without excessive erosion of underlying chamber surfaces.

SUMMARY

The present invention provides a method of etching a substrate in an etching chamber and cleaning off the etchant residues formed on the chamber surfaces. By surfaces in the chamber it is meant any surface inside the chamber enclosure including the walls of the chamber itself and the surfaces of the components in the chamber, such as the gas distributor, electrostatic chuck, focus ring and other components.

In one aspect, a method of treating a chamber by cleaning etchant residue from the chamber comprises providing a first energized process gas in the chamber to clean the surfaces and then providing a second and different process gas in the chamber to further clean the surfaces.

In another aspect of the invention, a method of etching a substrate in a chamber and cleaning etchant residue from surfaces in the chamber comprises placing the substrate in the chamber and, in a first stage, providing an energized first process gas comprising substrate etching gas and a first cleaning gas. In a second stage, an energized second process gas comprising a second and different cleaning gas is provided.

In another aspect of the invention, a method of etching a substrate in a chamber and cleaning etchant residue from surfaces in the chamber comprises placing the substrate in the chamber, etching a first material on the substrate thereby depositing a first etchant residue on the surfaces in the chamber, etching a second material on the substrate while suppressing deposition of a second etchant residue onto the first etchant residue, the first etchant residue being compositionally different from the second etchant residue, and cleaning the first and second etchant residue deposits formed on the surfaces in the chamber.

In another aspect of the invention, a method of etching a substrate in a chamber and cleaning etchant residue from surfaces in the chamber comprises electrostatically holding the substrate in the chamber, providing a first energized gas comprising an etching gas to etch the substrate and a residue cleaning gas, and providing a second energized gas in the chamber to clean etchant residue deposited on the surfaces in the chamber and simultaneously remove residual charge accumulated in the substrate.

In another aspect of the invention, a method of etching a substrate in a chamber and cleaning residue that forms on surfaces in the chamber comprises placing the substrate in the chamber, etching one or more materials on the substrate using energized gas, at least one composition of the energized gas including an etching gas comprising one or more of $Cl_2$, $N_2$, $O_2$, HBr and He—$O_2$ and a residue cleaning gas comprising one or more of $CF_4$, $SF_6$ and $NF_3$ and cleaning the residue formed on the surfaces in the chamber using another energized gas comprising oxygen.

In yet another aspect of the invention, a method of etching a substrate in a chamber and cleaning residue formed on surfaces in the chamber, the chamber comprising an electrostatic chuck, and the method comprising transferring a substrate into the chamber and electrostatically holding the substrate on the electrostatic chuck, providing an energized gas in the chamber to etch a mask layer on the substrate thereby forming residue on the surfaces in the chamber, the residue comprising chemical species originating from the mask layer, providing another energized gas comprising etching gas comprising one or more of $Cl_2$, $N_2$, $O_2$, HBr, and He—$O_2$ and residue cleaning gas comprising one or more of $CF_4$, $SF_6$, and $NF_3$ in the chamber to etch material below the mask layer, and providing an oxygen containing plasma in the chamber to assist in dechucking the substrate and to clean the residue formed on the surfaces in the chamber.

In yet another aspect of the invention, a method of cleaning a chamber to remove residue from surfaces in the chamber comprises providing an energized first process gas in the chamber to clean the surfaces in the chamber, and adjusting the chamber source power to control the amount of residue removed from the surfaces.

DRAWINGS

These and other features, aspects, and advantages of the present invention will be better understood from the following drawings, description and appended claims, which illustrate examples of the invention. While the description and drawings below illustrate exemplary features of the invention, it is to be understood that each of the features can be used in the invention in general, not merely in the context of the particular drawings, and the invention includes any combination of these features.

DESCRIPTION

Figure 2:
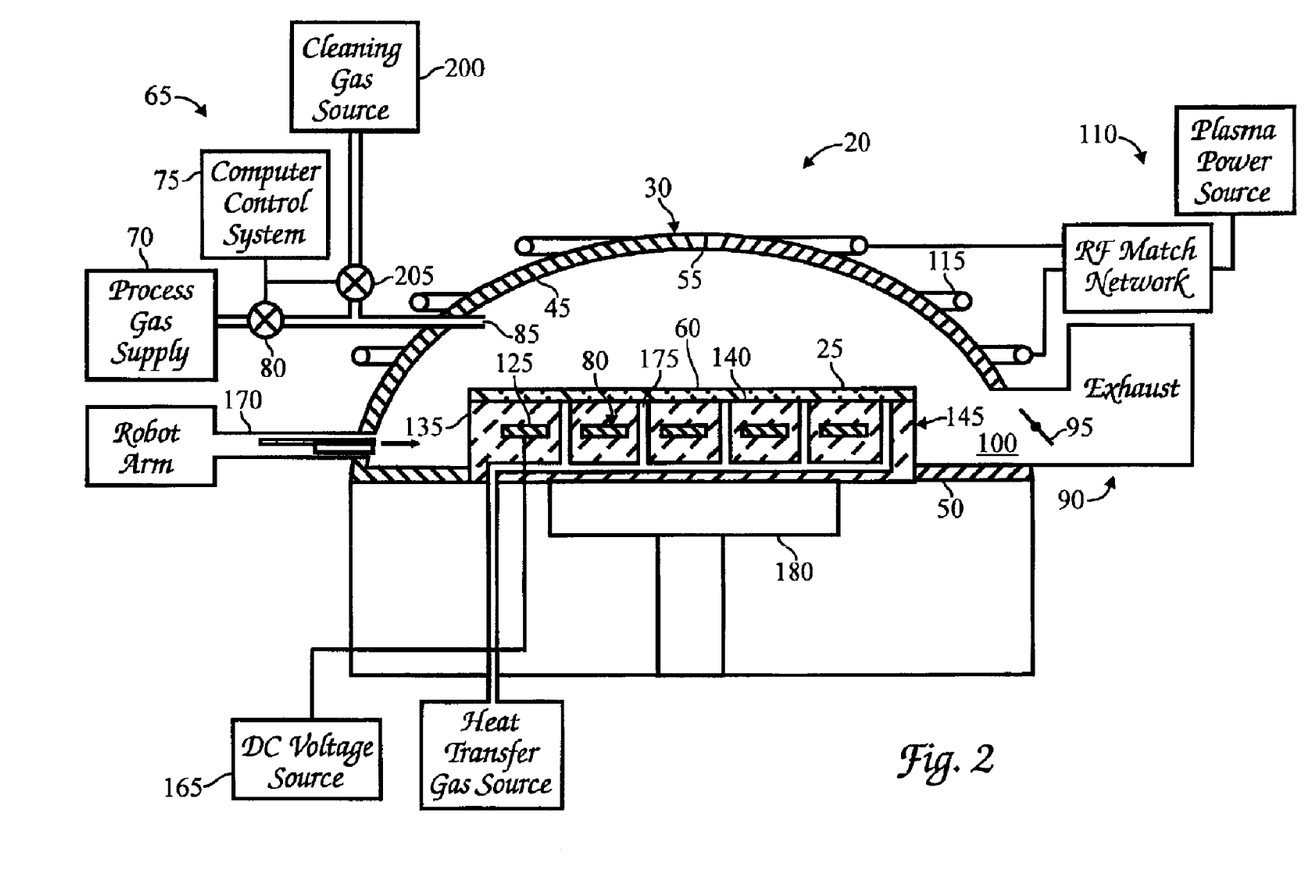
FIG. 2 is a sectional schematic side view of an etching apparatus of the present invention.

An apparatus 20 suitable for etching a substrate 25 according to the present invention, as schematically illustrated in FIG. 2, comprises an enclosed process chamber 30 defining a process zone for processing the substrate. A load-lock transfer area (not shown) is maintained at low pressure for holding a cassette of substrates 25. The particular embodiment of the apparatus 20 shown herein is suitable for processing of semiconductor substrates 25, is provided only to illustrate the invention, and should not be used to limit the scope of the invention. The enclosed chamber 30 has sidewalls 45 and a bottom wall 50 fabricated from any one of a variety of materials including metals, ceramics, glasses, polymers, and composite materials. The process zone defined in the etching chamber 30 comprises a volume of at least about 10,000 cm$^3$, and more preferably about 10,000 to about 50,000 cm$^3$ and is directly above and surrounds the substrate 25. The chamber comprises a ceiling 55 that is flat or rectangular shaped, arcuate, conical, dome-shaped, or multiradius dome shaped. The ceiling 55 is dome-shaped to provide a uniform distribution of plasma source power across the entire volume of the plasma process zone. The dome-shaped ceiling 55 is further from the substrate center 60 than a flat ceiling, and can reduce dissociated ion recombination losses near the substrate 25 to provide more uniform plasma ion density across the substrate surface than a flat ceiling. The dome ceiling 55 can be a flattened dome, conical, truncated conical, cylindrical, or other combination of such shapes, that provides a dome shaped surface above the substrate 25.

Process gas is introduced into the chamber 30 through a gas distribution system 65 that includes a process gas supply 70 and a gas flow control system that comprises a conventional computer system 75 operating a gas flow control valve 80. The gas distribution system 65 can comprise gas outlets 85 located peripherally around the substrate 25 (as shown), or a showerhead mounted on the ceiling of the chamber 30 with outlets therein (not shown). A second gas supply system 200 provides cleaning gas to the chamber 30 via an electronically operated valve 205. Spent process gas and etchant byproducts are exhausted from the process chamber 30 through an exhaust system 90 (typically including a 1000 liter/sec roughing pump) capable of achieving a minimum pressure of about 10$^{-3}$ mTorr in the chamber 30. A throttle valve 95 is provided in the exhaust 90 to control the flow of spent process gas and the pressure of process gas in the chamber 30. An asymmetric pumping channel 100 is used to pump gases out of the chamber 30 to provide a more symmetrical and uniform distribution of gaseous species around the surface 105 of the substrate.

A plasma is generated from the process gas introduced into the chamber 30, using a plasma generator 110 that couples an electromagnetic field into the gas in the process zone of the chamber. Alternatively process gas can be energized or activated in a remote chamber and the energized or activated process gas can be introduced into the chamber 30 from the remote chamber. A suitable plasma generator 110 comprises an inductor antenna 115 consisting of one or more inductor coils having a circular symmetry with a central axis coincident with the longitudinal vertical axis that extends through the center of the process chamber 30 and perpendicular to the plane of the substrate 25. The inductor antenna 115 comprises solenoid coils having from 1 to 10 turns, and more typically from 2 to 6 turns. The arrangement and number of solenoid coils are selected to provide the desired product of current and antenna turns (d/dt)(N−1) near the ceiling 56 to provide a strong inductive flux linkage with close coupling to the plasma and therefore greater plasma ion density in the plasma zone adjacent to the substrate 25, as described in U.S. patent application Ser. No. 08/648,254, which is incorporated herein by reference. When the inductor antenna 115 is positioned near the dome ceiling 55, the ceiling of the chamber 30 comprises dielectric material which is transparent to electromagnetic fields, such as a slab of machined silicon dioxide or tiles of silicon or silicon dioxide bonded to one another to provide a curved shape. The inductor coil 115 wrapped around the sidewall 45 of the process chamber 30 is a multiradius dome-shaped inductor coil having a "flattened" dome shape that provides increased plasma ion density directly over the substrate center 60 because ion density is affected by local ionization near the inductor coil 115, and a multiradius inductor coil is closer to the substrate center 60 than a hemispherical coil. In another embodiment, the ceiling 55 comprises a multiradius dome having at least a center radius R and a corner radius r, wherein r is less than the center radius R and R/r is from about 2 to about 10. The frequency of the RF voltage applied to the inductor antenna 115 is typically about 50 KHz to about 60 MHz, and more typically about 13.56 MHz; and the power level of RF voltage applied to the antenna is about 100 to about 5000 Watts.

The plasma formed in the plasma zone can also be enhanced using magnetically enhanced reactors, in which a magnetic field generator (not shown), such as a permanent magnet or electromagnetic coils, are used to apply a magnetic field in the plasma zone to increase the density and uniformity of the plasma. The magnetic field comprises a rotating magnetic field with the axis of the field rotating parallel to the plane of the substrate, as described in U.S. Pat. No. 4,842,683, issued Jun. 27, 1989, which is incorporated herein by reference. The magnetic field in the chamber should be sufficiently strong to increase the density of the ions formed in the plasma, and sufficiently uniform to reduce charge-up damage to features such as CMOS gates. Generally, the magnetic field as measured on the surface of the substrate is less than about 500 Gauss, more typically from about 10 to about 100 Gauss, and most typically from about 10 Gauss to about 30 Gauss.

In addition to the inductor antenna 115, one or more process electrodes can be used to accelerate or energize the plasma ions in the chamber 30. The process electrodes include a first electrode forming a wall of the process chamber 30, such as the ceiling 55 and/or sidewalls 45 of the chamber. The first electrode is capacitively coupled to a second electrode below the substrate 25. An electrode voltage supply supplies an RF potential that maintains the first and second electrodes at different electrical potentials relative to one another.

The enclosed chamber 30 comprises one or more ceramic surfaces that serve different functions. For example, in one embodiment, the walls 45, 50, 55 of the process chamber are coated with or made from a ceramic material, such as boron carbide, boron nitride, silicon, silicon oxide, silicon carbide, or silicon nitride, to protect the walls from chemically erosion in particular etchant gas compositions. For example, boron carbide is useful for protecting sidewalls 45 of chambers from erosion in fluorinated gaseous environments. As another example, sapphire (aluminum oxide) gas distribution plates can be used to release process gas into the chamber 30. When the chamber contains ceramic surfaces, the etchant residues are difficult to remove, because they can react with some of the ceramic surfaces in the chamber 30 (for example, the surface of the monolithic ceramic member 135 which has highly reactive surface functional groups) such as aluminum oxide, aluminum nitride, silicon, and silicon oxide ceramic surfaces. For example, aluminum oxide or nitride surfaces when exposed to oxygen or moisture form Al—OH$^-$ surface functional groups that chemically react with the etchant residue to form a hard adherent coating on the chamber surfaces or components.

Another ceramic surface useful in the process chamber 30 is that of a monolithic ceramic member 135 having a ceramic receiving surface 140 for receiving a substrate 25 thereon. Suitable ceramic materials include one or more of aluminum oxide, aluminum nitride, boron carbide, boron nitride, silicon, silicon oxide, silicon carbide, silicon nitride, and titanium oxide. The second electrode can be embedded in the ceramic member 135 so that ceramic material completely surrounds the second electrode to form a unitary monolithic ceramic member. The second electrode is fabricated from an electrical conductor metal such as tungsten, tantalum or molybdenum. The embedded second electrode is the conductor to which a "hot" RF potential is applied, with the other electrodes in the chamber 30 maintained at different potentials, including electrical ground or floating potentials, relative to the second electrode. Because it is embedded in the unitary ceramic member 135, the second electrode does not have to be electrically isolated from the chamber 30 by additional insulator shields, thereby reducing the parasitic capacitance impedance loads in the chamber 30 that would otherwise result between the second electrode and the grounded chamber walls 45, 50. An electrostatic chuck 145, which can be the second electrode, generates an electrostatic charge for electrostatically holding the substrate 25 to the receiving surface 140 of the ceramic member 135 using a DC chucking voltage applied through an electrical conductor inserted through the ceramic member 135 to connect to the electrode 125.

The first and second electrodes are electrically biased relative to one another by an electrode voltage supply that includes an AC voltage supply for providing a plasma generating RF voltage to the second electrode and a DC voltage supply 165 for providing a chucking voltage to the electrode. The AC voltage supply provides an RF generating voltage having one or more frequencies from 13.56 MHz to 400 KHz to form a capacitively coupled plasma in the chamber 30. The power level of the RF bias current applied to the electrode is typically from about 50 to about 3000 Watts. A separate DC voltage from the voltage supply 165 is applied to the electrode 125 to form an electrostatic field that holds the substrate 25 to the chuck 145. The RF power can be coupled to a bridge circuit and an electrical filter to provide DC chucking power to the electrode 125.

Operation of the etching chamber 30 to etch one or more of the layers on the substrate 25, and simultaneously clean the etching chamber, will now be described. The substrate 25 comprises, for example, a semiconductor material, such as a silicon or gallium arsenide wafer, with a plurality of layers comprising, for example, an underlayer of silicon dioxide that functions as a gate oxide layer for MOS transistors, and an overlayer of polycide, which is a combination of tungsten silicide, cobalt silicide, and underlying polysilicon layers. The metal silicide layer on the substrate 25 comprises, for example, tungsten, tantalum, titanium, or molybdenum silicides. A polysilicon layer is below the metal silicide layer and over a silicon dioxide layer. A patterned mask layer, such as photoresist, or a silicon dioxide or silicon nitride hard mask, is formed on the substrate 25. The exposed portions of the substrate between the mask layer are etched to form features, such as for example, contact holes for fabricating gate electrodes for MOS transistors; polycide interconnecting features that are typically used as gate electrodes; and vias which are multilayer metal structures used to electrically connect two or more electrically conductive layers separated by insulating silicon oxide/nitride layers. In another example, the substrate comprises silicon nitride layers or silicon oxide layers on a silicon (doped or undoped) substrate.

To perform the process of the present invention, a substrate 25 is transferred using a robot arm 170 from a load-lock transfer chamber through a slit valve and into the chamber 30. A lift finger assembly (not shown) has lift fingers that extend through lift finger openings in the chuck 145 to receive or lift the substrate 25 off the chuck 145. The robot arm 170 places the substrate 25 on the tips of the lift fingers (not shown) that are elevated by the pneumatic lift mechanism 180 to extend about 2 to 5 centimeters above the surface of the chuck 145. The pneumatic mechanism, under the control of a computer system, lowers the substrate 25 onto the electrostatic chuck 145, and helium is supplied through apertures 175 in the chuck to control the temperature of the substrate 25.

A process gas comprising etchant gas for etching the substrate is introduced into the chamber 30 through the gas outlet 85, and the chamber is typically maintained at a pressure ranging from about 0.1 to about 400 mTorr. Suitable etchant gases for etching layers on the substrate 25, include for example, HCl, $BCl_3$, HBr, $Br_2$, $Cl_2$, $CCl_4$, $SiCl_4$, $SF_6$, F, $NF_3$, HF, $CF_3$, $CF_4$, $CH_3F$, $CHF_3$, $C_2H_2F_2$, $C_2H_4F_6$, $C_2F_6$, $C_3F_8$, $C_4F_8$, $C_2HF_5$, $C_4F_{10}$, $CF_2Cl_2$, $CFCl_3$, $O_2$, $N_2$, He, and mixtures thereof. The etchant gas is selected to provide high etch rates, and highly selective etching of the particular layers that are being etched. When multiple layers are sequential etched, first, second, third, etc., etchant gas compositions are sequentially introduced into the chamber to etch each particular layer. Referring to FIG. 2, a plasma is energized from the etchant gas using the plasma generator 110 by inductively and/or capacitively coupling energy into the chamber 30. For example, the plasma can be formed by applying an RF source current to the inductor antenna 115 encircling the chamber 30, and applying an RF bias voltage to the electrodes. The etchant gas ionizes in the applied electric field to form ions and neutrals that etch the layer on the substrate 25 to form volatile gaseous species that are exhausted from the chamber 30.

The present process allows etching of one or more layers on a substrate 25 and simultaneous cleaning of the plasma etching chamber 30 in which the etching process is performed, without stopping the etching process. In one or more of the etch process stages, a cleaning gas is added to the etchant gas in a volumetric ratio selected so that the etching residue formed in any one of the etching stages; or the residue formed in all of the etching stages is substantially entirely removed during the etching process. The etchant gas comprises one or more of $Cl_2$, $N_2$, $O_2$, HBr, or He—$O_2$; and the cleaning gas comprises one or more of $NF_3$, $CF_4$, or $SF_6$. It has been discovered that combinations of these gases provide unique and unexpected etching and cleaning properties.

The volumetric flow ratio of cleaning gas to etchant gas is selected to remove the etchant residue generated from processing at least 2000 to at least 3000 substrates 25 without performing a separate cleaning step for cleaning the chamber 30 in between processing of the substrates. A suitable volumetric flow ratio of cleaning gas to etchant gas is from about 1:20 to about 1:1, and more preferably from about 1:10 to about 2:3, and most preferably about 2:3. It has been discovered that at these volumetric flow ratios of cleaning gas to etchant gas, substantially all the etchant residues on the chamber surfaces 45, 50, 55 are removed without eroding the chamber surfaces. In addition, it has been unexpectedly discovered that the chamber surfaces are cleaned and conditioned by the etchant and cleaning gas combination step, without requiring a separate chamber conditioning or seasoning step. The synergism of etching the substrate 25 and simultaneously removing the etching residues from the surfaces in the chamber 30 (without terminating the etching process or requiring separate cleaning or conditioning steps) provides significantly improved process stability from substrate to substrate, and increased process throughput.

In one example of the present process, a substrate 25 comprising metal silicide or silicon (i.e., polycrystalline or monocrystalline silicon), is etched using a plasma of process gas comprising $Cl_2$, $N_2$, and $CF_4$, and optionally $O_2$, in a volumetric flow ratio selected to remove substantially all the etchant residue formed on the chamber surfaces upon completion of the etching process. The volumetric flow ratio of $Cl_2$, $N_2$, and $CF_4$ is selected to remove substantially all the etchant residue generated by etching at least 2000 substrates 25 in the chamber 30, without performing a separate cleaning step for cleaning the chamber. The ratio of the volumetric flow ratio of $CF_4:(Cl_2+N_2)$ may be from about 1:20 to about 1:1. In another example, the process uses a process gas comprising $Cl_2$, $N_2$, and $SF_6$, the volumetric flow ratio of $SF_6:(Cl_2+N_2)$ being from about 1:20 to about 1:1. In yet another example, a suitable process gas comprises $Cl_2$, $N_2$, and $NF_3$, the volumetric flow ratio of $NF_3:(Cl_2+N_2)$ being from about 1:20 to about 1:1.

A burst of cleaning gas is introduced into the etching chamber 30 for a short burst of time to treat and condition the chamber surfaces, while the substrate 25 is still being etched by the etchant gas. Process gas comprising etchant gas is introduced into the chamber 30, and the composition of the process gas is adjusted to the desired etchant gas composition to etch one or more of the different layers of material on a substrate. During the etching process, a short burst of cleaning gas is added to the process gas while the substrate is still being etched. For example, the burst of cleaning gas can be added to the etchant gas used to etch a polysilicon layer (during the main etch of the polysilicon layer) and terminated before the polysilicon overetching step. The burst of activated cleaning gas provides a larger number of highly reactive cleaning species that removes the freshly deposited etchant residues before they can chemically adhere to the chamber surfaces. Also, a first etchant gas composition can generate a first etchant residue that is weakly adhered to the chamber surfaces or that has a chemically soft and reactive composition; however, when second etchant gas is introduced into the chamber, the second etchant gas can react with the first etchant residue and make it a chemically hard sticking residue. In these processes, the short burst of cleaning gas is introduced into the chamber during the first stage of the etch process, to remove the freshly generated etchant residue before it is chemically changed by exposure to another chemical gas composition. A high flow rate burst and quick removal of the cleaning gas from the chamber 30 also reduces the possibility of the cleaning gas combining to form other chemical species that erode the chamber surfaces and components. This mechanism is further aided by the high flow rates of the burst of gas which flush out reaction byproducts from the chamber 30. The burst of activated cleaning gas may be introduced into the etching chamber at a flow rate FR equivalent to a rate of at least about 40 to about 200 sccm for an etching chamber 30 having a volume of about 40,000 $cm^3$ for a time period of about 5 to about 100 seconds to clean the etchant residue, substantially without eroding the walls 45, 50, 55 and components in the chamber 30.

After completion of processing, the substrate 25 is dechucked using suitable dechucking means. A pneumatic lifting apparatus 180 raises lift pins through the electrostatic chuck 145 to raise the substrate 25 and a robotic transport arm is inserted between the substrate 25 and the chuck to lift the substrate off the lift pins. Thereafter, the lift pins are retracted into the chuck 145, and the robotic arm transports the first substrate 25 out of the etching chamber 30 and into a transfer chamber maintained in a vacuum environment.

Multiple Etching Stages

Figure 3:
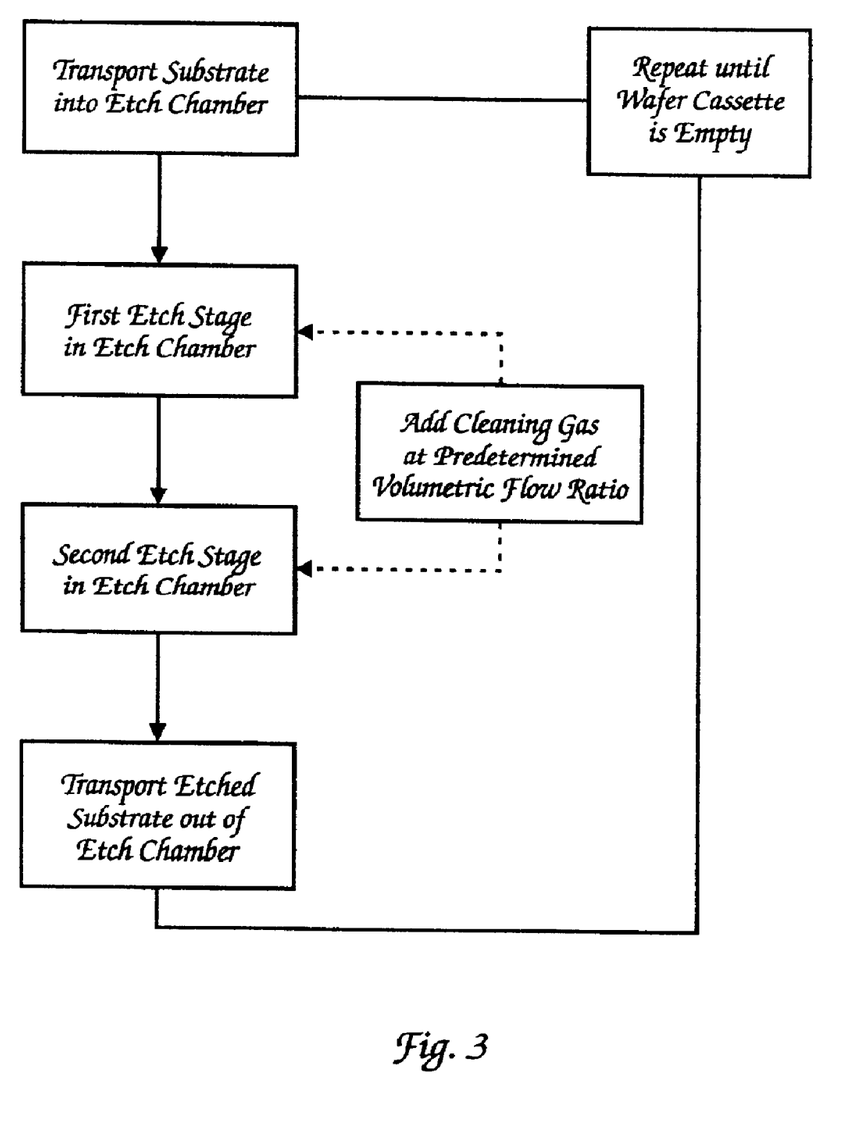
FIG. 3 is a flowchart of the process steps used to etch substrates and simultaneously clean the surfaces of the etching chamber and its components.

In another aspect of the present process, multiple stages are used to etch multiple layers on the substrate, and the cleaning gas is introduced in at least one of the stages to remove the etchant residue deposited on the chamber surfaces in one or more of the multiple etching steps, as illustrated in FIG. 3. This process is useful for etching, for example, polycide structures that comprise multiple layers of tungsten silicide and polysilicon layers or for etching silicon nitride layers or silicon dioxide layers on silicon wafers. Although the present process is illustrated in the context of etching such layers, it should be understood that the process can be used to etch other layers such as metal layers and silicon dioxide layers. Thus, the present process should not be limited to the examples and illustrative methods provided herein.

The multi-stage process comprises a plurality of etching stages. In a first etching stage, a first etchant gas is introduced into the process chamber 30, and a plasma is formed from the first etchant gas to etch the first layers on the substrate 25 (for example, a tungsten silicide layer). The first or tungsten silicide layer is typically etched using a first etchant process gas comprising chlorine-containing gases, for example a mixture of chlorine and nitrogen, and optionally oxygen. The volumetric flow ratio of chlorine to nitrogen is about 1:3 to about 1:1, and more preferably about 2:3. The pressure in the chamber 30 is maintained at 1 to 10 mTorr, the inductor coil source power level at 200 to 800 Watts, and the process electrodes R.F. bias power level at 20 to 120 Watts.

In the second etching stage, a second etchant gas is introduced into the chamber 30, and a plasma is formed to etch the second layers (for example a polysilicon layer below the tungsten silicide layer) after the first layer has completed etching. The second or polysilicon layer can be etched in more than one etching process step, with the etchant gas composition being changed during each etching step. Suitable second etchant gas compositions comprise $Cl_2$ in a flow rate of from 20 to 120 sccm, HBr at about 80 to 240 sccm, and He—$O_2$ at about 2 to 10 sccm. The chamber pressure is from about 25 to 200 mTorr. The power level of the source current applied to the inductor antenna 115 is from about 200 to 800 Watts, and the bias RF power level of the voltage applied to the process electrodes, is from about 20 to 120 Watts.

In one or more of the first and second stages, a cleaning gas is added to the etchant gas in a volumetric ratio selected so that the etching residue formed in any one of the stages is substantially entirely removed during the etching process. The etchant residue formed in the first and second stages typically comprises polymeric organic compounds containing halogen, carbon, hydrogen, and oxygen. When silicon-containing layers are being etched, the etchant residue comprises predominantly silicon dioxide compounds formed during etching of both the tungsten silicide and polysilicon layers on the substrate 25. However, the composition of etchant residue can vary from the first to the second layer, the first etchant residue composed more of W and Si species, and the second etchant residue composed more of Si and O species. Thus the cleaning gas is added to the process gas in the first or second stage, in a volumetric ratio suitable for removing the first etchant residue formed in the first etching stage in which the tungsten silicide layer was etched, as well as the second etchant residue formed during the second etching stage in which the polysilicon layer was etched. It has been discovered that a suitable volumetric flow ratio of cleaning gas to etchant gas is from about 1:10 to about 2:3. For example, to a flow rate of first etchant gas of about 80 sccm $Cl_2$ and 40 sccm $N_2$, was added a cleaning gas comprising $CF_4$ at a flow rate of 80 sccm, to provide a volumetric ratio of cleaning gas to first etchant gas of about 2:3. It has been discovered that at these volumetric flow ratios of cleaning gas to etchant gas, substantially all the etchant residues on the chamber surfaces (which are formed during the different stages of the etching process) are removed without eroding the chamber surfaces. In addition, it has been unexpectedly discovered that the chamber surfaces are cleaned and conditioned by the etchant and cleaning gas combination, without requiring a separate seasoning or conditioning process step.

The chamber treatment process of the present invention has been found to uniformly remove etchant residues, irrespective of their thickness or chemical composition, during performance of an etching process. Prior art cleaning processes, particularly those performed by an operator, often fail to uniformly clean and remove the etchant residue deposits formed on chamber surfaces. Build-up of etchant deposits on the chamber surfaces, result in flaking off the etchant deposits and contamination of the substrate 25 etched in the chamber. By uniformly removing the etchant residues formed across substantially all of the chamber surfaces, such contamination and resultant reduced substrate 25 yields, are substantially minimized.

The cleaning gas also results in much less erosive damage to the chamber compared to conventional in-situ plasma cleaning steps, because of the reduced energy levels of the plasma in the etching chamber. This was difficult to accomplish in prior art processes, in which high powered plasmas used to remove the residue deposits also resulted in extensive erosion of chamber surfaces and components. By reducing the need to replace chamber components, the cost of operating the chamber 30 and the cost per substrate 25 are significantly reduced. Furthermore, the activated cleaning gas can be used to efficiently clean an chamber 30 in-situ during etching of substrates 25, rather than stopping processing to wet clean the chamber walls and components, thereby increasing etching throughput and further reducing costs per substrate. The cleaning process is expected to increase chamber lifetimes by a factor of at least 2, and also increase substrate yields by reducing the deposition of flaked-off etchant byproducts onto the substrate.

The cleaning process removes chemically-adhered etchant deposits from the surfaces in the chamber 30, and restores the original chemical reactivity and surface functional groups of these surfaces, without requiring a chamber conditioning process after the cleaning process. The cleaning and treatment process is also particularly useful for cleaning etchant residue that is strongly adhered to, or chemically reacted with chamber surfaces. The cleaning gas is effective at treating and reconditioning these ceramic surfaces to provide surface chemistries and surface functional groups that are chemically compatible with the etching process. The conditioned ceramic surfaces provide more reproducible etching properties in the chamber 30, than that provided by alternative chamber cleaning processes, such as wet cleaning or RIE cleaning processes. The significantly improved reproducibility of etching processes performed in the chamber 30 is highly desirable.

Multiple Cleaning Stages

In one aspect of the present invention, multiple layers of different materials on a substrate 25 are etched in an etching chamber 30, and the etchant residue formed on the internal surfaces of the etching chamber are removed or cleaned by a multiple step cleaning process. The multiple layers may be etched utilizing the chamber of FIG. 2 and the etching gas may include for example, HCl, $BCl_3$, HBr, $Br_2$, $Cl_2$, $CCl_4$, $SiCl_4$, $SF_6$, F, $NF_3$, HF, $CF_3$, $CF_4$, $CH_3F$, $CHF_3$, $C_2H_2F_2$, $C_2H_4F_6$, $C_2F_6$, $C_3F_8$, $C_4F_8$, $C_2HF_5$, $C_4F_{10}$, $CF_2Cl_2$, $CFCl_3$, $O_2$, $N_2$, He, and mixtures thereof. The layers being etched comprise, for example, mask or other hard layers overlying a number of silicon-containing layers—by which it is meant a layer composed of any material containing the element silicon including elemental silicon and all its compounds thereof. The substrate 26 typically comprises a semiconductor material, such as silicon or gallium arsenide wafer, with an exemplary set of layers comprise, for example, an underlayer of silicon dioxide that functions as a gate oxide layer for MOS transistors and a polycide overlayer comprising a combination of metal silicide and silicon-containing layers. The metal silicide layer comprises, for example, tungsten, tantalum, titanium, or molybdenum silicide. A mask layer comprising photoresist or hard mask such as, for example, silicon dioxide or silicon nitride, is formed on the substrate 25. In the etching process, the mask layer is etched in the etching chamber 30, then the metal silicide layer is etched in the same chamber, thereafter a main and overetch etch step for etching polysilicon is also performed in the same chamber. A conventional process sequence for etching the multiple layers includes a mask etching step, a tungsten silicide etching step, and main and overetching steps for etching the polysilicon layer, as illustrated in Table 1. These process steps are followed by a dechucking step in which a plasma of nitrogen (which is non-reactive to the multi-layer residue deposit) is used to assist in dechucking the substrate from the electrostatic chuck. The nitrogen based plasma provides opposite charges, for example an electronegative charge, which neutralize the electrostatic charge formed on the substrate allowing the substrate to be easily removed from the chuck.

TABLE 1

| Process Step | Pressure (m Torr) | Source Power (Watts) | Bias Power (Watts) | Process Gas Composition (sccm) |
|---|---|---|---|---|
| Etch $Si_3N_4$ mask | 4 | 950 | 300 | 45 $CF_4$/130 He/20 $CH_2F_2$ |
| $WSi_x$ | 5 | 300 | 100 | 50 $Cl_2$ |
| Polysilicon ME | 4 | 270 | 40 | 20 $Cl_2$/90 HBr/4 He-$O_2$ |
| Polysilicon OE | 50 | 500 | 80 | 50 HBr/3 He-$O_2$ |

Figure 4:
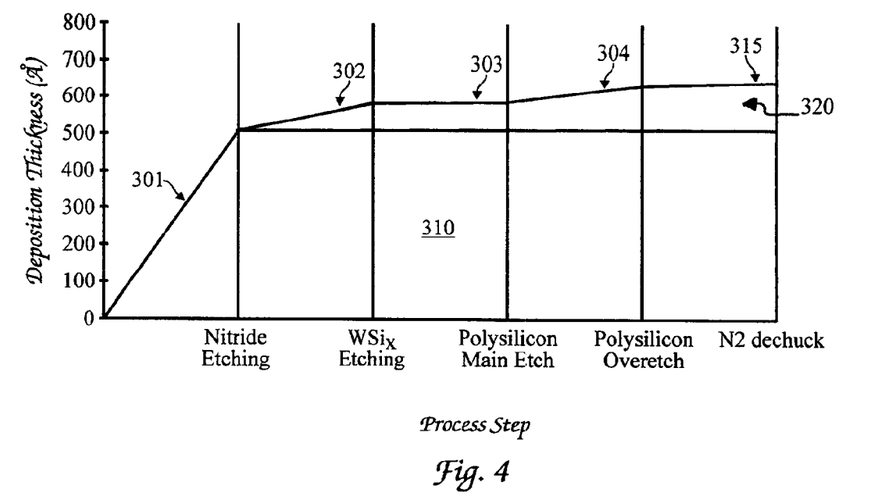
FIG. 4 is a graph showing the components of a multilayer etchant residue formed on internal surfaces of the chamber by a conventional process in which a substrate comprising a mask layer and underlying silicon-containing layers was etched.

It has been discovered that when a multiple step etching process is performed in a single chamber, such as the exemplary process described above, the etchant residue formed on the chamber walls and surfaces is especially difficult to remove by conventional etch cleaning processes. The processing of multiple layers of material sequentially in a single chamber, such as etching of an overlying hard mask layer followed by etching of an underlying polycide layer, results in formation of an etchant residue comprising multilayers or having a sandwich-type structure, on the internal surfaces of the chamber. For example, FIG. 4 illustrates the compositional profile of the sandwich-type residue that is deposited onto surfaces of chamber walls and components by such an etching process. In this example, the substrate comprised a silicon wafer containing a 1000 Å gate oxide layer, 1000 Å polysilicon layer, 1200 Å tungsten silicide layer, a 2400 Å silicon nitride mask layer, and an overlying 8000 Å I-line photoresist layer. During the nitride mask etch step 301 a relatively large amount of a fluorocarbon based polymer residue 310 is deposited on the chamber surfaces. During subsequent steps for etching other silicon-containing layers, for example the metal silicide etching step 302, polysilicon main etching step 303, and the polysilicon over-etching step 304, a layer of silicon dioxide 320 is deposited over the fluorocarbon based polymer deposit 310. This layer of silicon dioxide 320 (100–200 A) prevents the cleaning gas from reaching or chemically attacking the underlying polymer residue 310. As a result, the multi-step etching process creates a multilayer residue that is difficult to remove by conventional cleaning processes. Additionally, the sandwich-type multilayer deposit is prone to flaking and depositing contaminants on the substrate during the etching process, especially because the coefficient of thermal expansion of each of the layers can often differ widely from one another. In the conventional process, a sandwich-type deposit was formed on the internal surfaces of the chamber typically had a total thickness of from about 0 to about 10 microns.

It has been further discovered that a multiple step etching and cleaning process is more effective at removing the multi-layer residue from the internal surfaces of the chamber 30. The multiple step cleaning process comprises multiple cleaning stages, each cleaning stage being tailored to remove one of the layers of the residue. For example, if the residue comprises a first layer of silicon-containing material, such as a layer comprising predominantly silicon dioxide, the first cleaning gas comprises primarily silicon or silicon dioxide removing gases, or gases that suppress the formation of the silicon-containing layer. Thereafter, the second layer of residue, such as a layer of fluorocarbon polymer residue is removed using a second cleaning gas comprising primarily fluorocarbon polymer removing species. The two stage cleaning process is far more effective at providing a clean internal surface of the chamber than a single stage cleaning process.

In the illustrative example provided herein, the process conditions for etching the nitride mask layer, etching the tungsten silicide layer and a first cleaning/residue suppression step, and the main and overetch process steps for etching the polysilicon layer, as well as a second clean step using oxygen containing cleaning gas, are shown in Table 2.

TABLE 2

| Process Step | Pressure (m Torr) | Source Power (Watts) | Bias Power (Watts) | Process Gas Composition (sccm) |
|---|---|---|---|---|
| Etch $Si_3N_4$ mask | 4 | 950 | 300 | 45 $CF_4$/130 He/20 $CH_2F_2$ |
| $WSi_x$ (clean) | 4 | 600 | 60 | 80 $Cl_2$/80 $CF_4$/40 $N_2$ |
| Polysilicon ME | 4 | 270 | 40 | 20 $Cl_2$/90 HBr/4 He-$O_2$ |
| Polysilicon OE | 50 | 500 | 80 | 50 HBr/3 He-$O_2$ |
| $O_2$ cleaning | 15 | 500 | | 95 $O_2$ |

The silicon nitride layer was first etched through to form a patterned hard mask layer using an overlying photoresist layer. For purposes of example and without intent to limit the invention, the exemplary process utilizes a plasma of 45 sccm $CF_4$, 130 sccm He, and 20 sccm $CH_2F_2$ to etch the mask layer, for example a nitride-containing mask layer, in a process chamber at 4 mTorr pressure with a source power of 950 Watts and a bias power of 300 Watts.

Thereafter, an energized gas comprising a combination of etching gas and first cleaning gas was used to both etch a layer on the substrate, such as the metal silicide layer, and suppress the deposition of the silicon dioxide containing etchant residue on the chamber surfaces. The cleaning gas is added to the etchant gas in a volumetric flow ratio selected to suppress the deposition of silicon dioxide onto the polymer deposit formed by the earlier etching stage in which the mask layer comprising silicon nitride is etched. It has been found that the silicon dioxide residue deposited during subsequent etching steps is sufficiently thin to allow a subsequent cleaning stage to remove both the remaining silicon dioxide containing material as well as the fluorocarbon material of the remaining residue. This combination of a silicon-containing layer etch process step in which formation of a silicon dioxide containing residue is suppressed and a subsequent second cleaning step results in an unexpectedly clean chamber where substantially all the residue, and in some cases all of the residue is removed upon completion of the etch process.

The metal silicide layer can be etched with an etching gas comprising one or more of $Cl_2$, $N_2$, $O_2$, HBr, and He—$O_2$, and more preferably $Cl_2$ and $N_2$. The cleaning gas can comprise one or more of $CF_4$, $SF_6$, and $NF_3$, and more preferably $CF_4$. The volumetric flow ratio of etching gas to cleaning gas is selected to adequately etch the desired features in the layer and to suppress the deposition of silicon dioxide 320 onto the deposition of residue from the mask etch 310. The etching gas to cleaning gas volumetric flow ratio is about 1:1 to about 1:20, and is more preferably about 3:2. In a particular composition the process gas comprises 80 sccm $Cl_2$, 80 sccm $CF_4$, and 40 sccm $N_2$. The source power is from about 200 and about 800 Watts, and is more preferably about 600 Watts. The bias power is from about 20 Watts to about 120 Watts, and is more preferably about 60 Watts. The pressure in the chamber is from about 1 mTorr to about 50 mTorr and more preferably is about 4 mTorr.

Thereafter, the polysilicon layer is etched in two stages including a main etching stage and an overetching stage. The main etching stage is performed using a plasma of process gas comprising 20 sccm $Cl_2$, 90 sccm HBr, and 4 sccm He—$O_2$; a pressure of 4 mTorr, 270 Watts source power, and 40 Watts bias power. The over etch is performed using a process gas comprising 50 sccm HBr and 3 sccm He—$O_2$ and optionally $Cl_2$ in a chamber maintained at a pressure of 50 mTorr and 500 Watts source power.

In the present example, it has been further discovered that an oxygen containing plasma can be used to remove the remaining silicon dioxide containing and fluorocarbon based polymer residue 310 remaining on the walls and surfaces of the chamber. The oxygen plasma cleaning step is performed after etching or otherwise processing the last residue creating layer on the substrate, such as the polysilicon overetching step. In this step an oxygen-containing gas, such as an oxygen species generating gas, oxygen or ozone is introduced into the chamber, and a plasma is sustained by applying a current at a power level of 500 Watts to the inductor coil. The oxygen flow is maintained at about 95 sccm and at a gas pressure of 15 mTorr. The oxygen plasma cleans off substantially all the residue remaining on the chamber surfaces including a relatively thin layer of silicon dioxide residue. The removal of the underlying polymer deposit 310 is much more difficult if the deposit is covered by and partially protected from the cleaning gas by a thick overlying layer of silicon dioxide residue 320. Additionally, the oxygen plasma also serves to remove residual charge in the chamber to dechuck the substrate when the substrate is electrostatically held on an electrode in the chamber by providing an opposite charge, for example an electronegative charge.

The cleaning gas used to clean the residue from the walls and surfaces of the chamber can also comprise other gas compositions that clean a combination of the fluorocarbon polymer residue 310 and silicon dioxide containing residue 320. For example, the cleaning gas can also comprise oxygen at a pressure from about 1 mTorr to about 100 mTorr in a plasma sustained at a source power from about 200 Watts to about 1000 Watts. In another example, the process gas comprises 95 sccm $O_2$ at 15 mTorr pressure and the plasma is formed at a 500 Watts source power level.

Figure 5:
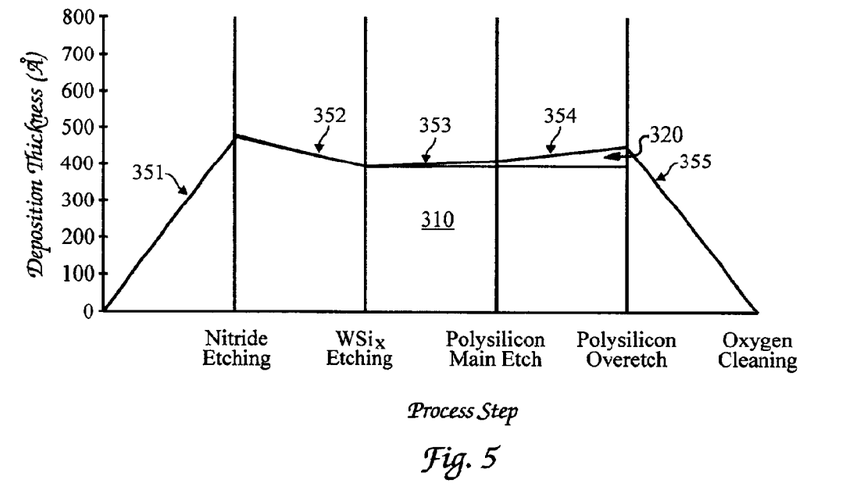
FIG. 5 is a graph showing the components of a multilayer etchant residue formed on internal surfaces of the chamber by a process of the present invention in which a substrate comprising a mask layer and underlying silicon-containing layers was etched.

FIG. 5 is a schematic graph illustrating the compositional profile of the etchant residue that is deposited on the walls of the chamber by the method of the present invention during the process steps of etching of the nitride mask 351, the metal silicide etch 352, the polysilicon layer main etch 353, the polysilicon over etch 354, and the oxygen gas cleaning step. The data in FIG. 5 was obtained using the same type of substrate as that used for the data in FIG. 4. Comparing FIGS. 4 and 5, it is apparent that the present process significantly improves on the former process by eliminating a 600–700 Å thick residue that was previously formed on the chamber surfaces after substrate processing. While the mask layer etch step 351 continues to produce a fluorocarbon based polymer residue 310 that deposits on the surfaces in the chamber; the metal silicide etch step 352 has been discovered to deposit little or no silicon dioxide 320 over the polymer deposit 310. The subsequent steps 353, 354 deposit a much thinner silicon dioxide layer 320 than the conventional process. This thinner layer of silicon dioxide 320 allows the cleaning gas to attack the polymer deposit 310 and clean the chamber. When the substrate processing is complete, a substantially clean chamber awaits further use, and the chamber can often be re-used without any further manual cleaning of its internal surfaces.

Referring to FIG. 5, it can be seen that, as before, the majority of the passivating layer depositions occurred during the etching of the silicon nitride mask layer on the substrate. This occurs because the overlying resist layer is substantially etched away from the surface of the substrate in addition to the etching of the apertures through the silicon nitride layer, which contributes silicon and nitrogen species into the environment. The combination of etch resist, silicon, and nitrogen form the polymer deposition on the surfaces in the chamber. Thereafter, in the WSiX etching step in which a cleaning gas is added to maintain the chamber clean, a net reduction in the deposition thickness of the passivating layer results due to removal of the passivating layer by the fluorinated $CF_4$ gas. During the main and overetching steps for etching the polysilicon layer, the thickness of the deposition layer is made substantially constant; however, towards the end of the polysilicon overetching step, a net thickness of silicon oxide is being deposited. Although a small amount of silicon oxide is deposited to form the sandwiched layer, this amount is much smaller than the amount deposited in the prior art process by a factor of over about 2.

Figure 6:
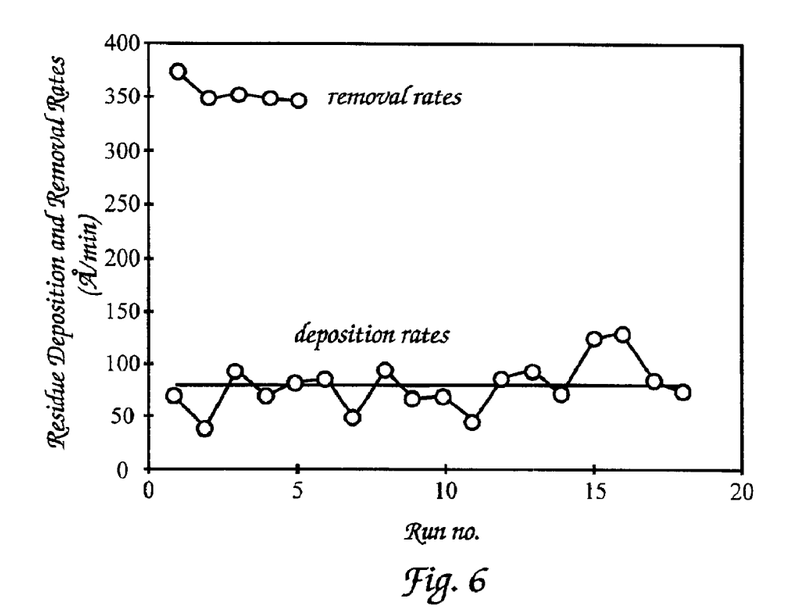
FIG. 6 is a graph showing the deposition and removal rate of etchant residue formed on a bare silicon wafer.

In another illustrative example, provided to further test and understand the effectiveness of a multiple step cleaning process, FIG. 6 shows both the deposition and removal rate of a residue layer formed on the surface of a bare silicon wafer. The residue layer was formed by exposing the substrate to a process gas comprising 45 sccm $CF_4$, 130 sccm He, 20 sccm $CH_2F_2$, a bias power of 350 Watts, and a cathode temperature of 65° C. It is seen that the residue deposition is relatively constant and from about 75 to 125 Å per minute. The polymer residue deposited on the bare silicon wafer was thereafter removed by the following process conditions: an oxygen flow rate of 95 sccm, a gas pressure of 15 mTorr, a source power of 500 Watts, no bias power, and a 65° C. cathode temperature. The removal rate as shown in the graph was much higher, on the order of 350 Å/minute. The much higher efficiency of the oxygen containing cleaning step—as compared to the rate of deposition of the residue—indicates that the residue can be rapidly and efficiently removed by the present process and without excessively reducing the down-time of the substrate processing apparatus.

Figure 7:
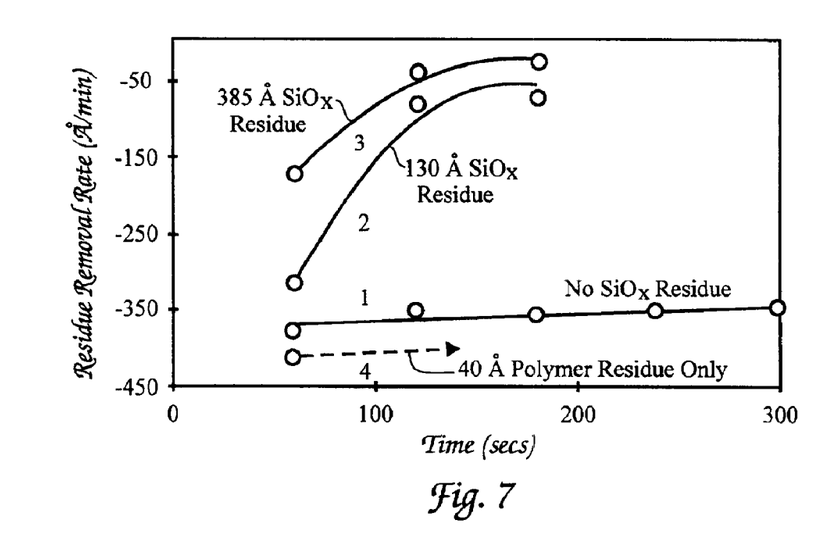
FIG. 7 is a graph showing the rate of removal of residue having different compositions and thicknesses.

In FIG. 7, the rate of removal of multi-layer residue comprising layers with different compositions and thicknesses is shown. In these examples, a residue comprising compositionally different layers was formed on a specimen. The residue on specimen 1 was composed simply of polymer with no silicon dioxide thereon. The residue on specimen 2 comprised a layer of polymer residue and a 130 Å overlying layer of silicon dioxide containing residue. Specimen 3 had a 385 Å thickness of silicon oxide on a polymer residue layer. Finally, specimen 4 had no silicon oxide deposition, but simply a 40 Å thickness layer of polymer residue. It is seen that the specimens 1 and 4 which had only polymer residue were removed at a much higher rate of 350 Å to 400 Å relative to the residues containing silicon dioxide, namely specimens 2 and 3. In fact, the rate of removal of the residue deposited on specimens 2 and 3 ranged from 50 Å to about 350 Å. Thus, removal of the silicon oxide layer (specimens 1 and 4) increases the rate of removal of the polymer residue by approximately 6 to 8 times, which is a significantly and unexpectedly higher rate of removal. It is also seen that reducing the thickness of silicon dioxide containing residue formed over the polymer residue—from about 385 Å to about 130 Å—resulted in a net change in the average rate of removal of the residue from about 100 Å/min to 200 Å per minute, or twice as fast. This provided a significant improvement in the rate of removal of the residue which was wholly unexpected.

Figure 8:
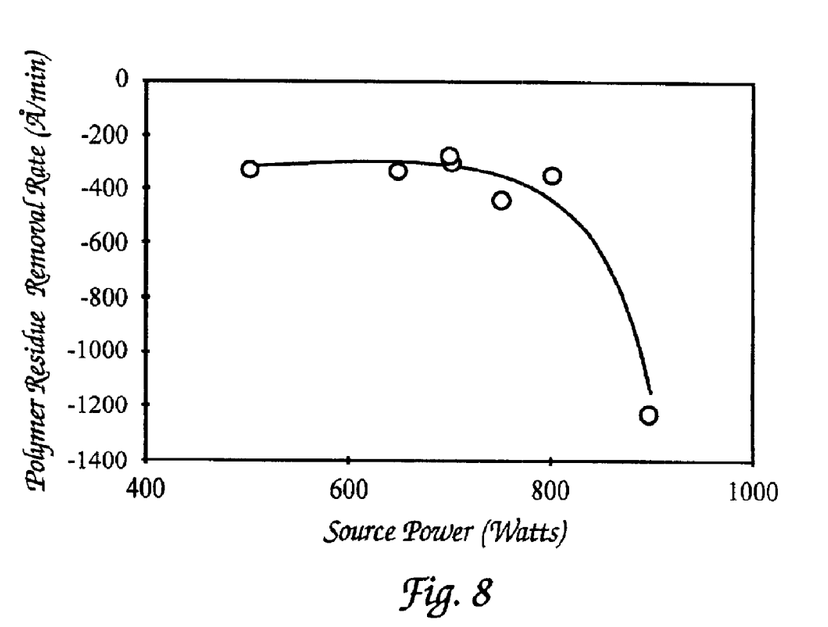
FIG. 8 is a graph showing the rate of removal of residue for increasing plasma source power levels.

In yet another example, FIG. 8 shows the rate of removal of residue for increasing power levels applied to the inductor coil. In this example, the process conditions included an oxygen flow rate of 95 sccm, a pressure of 15 mTorr, a variable amount of source power, 0 Watts bias power, and a cathode wall temperature of 65° C. It is seen that as the source power is increased from 400 Watts to about 750 to 800 Watts, the rate of removing residue remains constant at about 320 Å/minute. However, at a source power level of from about 800 to about 900 Watts, the rate of residue removal is significantly improved and increases from 350 Å to 1200 Å/minute. Thus, it has also been discovered in another aspect of the invention, that the source power level should be maintained at a high level. The selected source power level depends upon the composition of the process gas, the gas pressure, and is typically at least about 700 Watts. Residue removal rates exceeding about 600 Å/minute have been obtained at these power levels.

A quartz crystal microbalance (QCM) was used to determine the amounts of etchant residue being deposited onto the chamber surfaces during the etching process. The quartz crystal microbalance comprises a piezoelectric plate that changes in capacitance when a film of etchant residue is deposited thereon as described in U.S. patent application Ser. No. 09/116,621, the disclosure of which is incorporated herein by reference. In making the presently disclosed measurements, the microbalance was mounted on an internal surface of the process chamber and its leads were connected to a computer outside the process chamber.

The present invention has been described with reference to certain versions thereof; however, other versions are possible. For example, the treatment and cleaning process of the present invention can be used for treating chambers for other applications, as would be apparent to one of ordinary skill. For example, the process can be applied, as would be apparent to one of ordinary skill in the art, to treat sputtering chambers, ion implantation chambers, or deposition chambers, or in combination with other cleaning processes. Therefore, the spirit and scope of the appended claims should not be limited to the description of the versions contained herein.

What is claimed is:

1. A method of treating a chamber to at least partially remove residue from surfaces in the chamber, the method comprising:
   (a) transferring a substance into the chamber and electrostatically holding the substrate on an electrostatic chuck;
   (b) providing an energized first process gas comprising one or more of $CF_4$, $SF_6$ ad $NF_3$ in the chamber to treat the surfaces in the chamber; and
   (c) providing an energized second process gas in the chamber to further treat the surfaces in the surfaces in the chamber and to assist in de-chucking the substrate from the electrostatic chuck, the second process gas being different than the first process gas.

2. A method according to claim 1 wherein the second process gas comprises an oxygen containing gas.

3. A method according to claim 2 wherein the oxygen containing gas consists essentially of oxygen.

4. A method according to claim 1 wherein the treating of the chamber comprises cleaning a surface of a wall in the chamber.

5. A method of etching a substrate comprising a metal silicide containing layer and a polysilicon containing layer in a chamber and cleaning etchant residue formed on surfaces in the chamber, the method comprising the steps of:
   (a) electrostatically holding the substrate comprising the metal silicide and polysilicon containing layers on an electrostatic chuck in the chamber;
   (b) in a first stage, providing an energized first process gas in the chamber to etch through the metal silicide containing layer, the first process gas comprising a substrate etching gas and a first cleaning gas comprising a fluorinated gas;
   (c) in a second stage conducted after (b), providing a second energized process gas in the chamber to etch through the polysilicon containing layer; and
   (d) in a third stage conducted after (c), providing an energized second cleaning gas comprising an electronegative plasma in the chamber, the energized second cleaning gas being different from the first cleaning gas.

6. A method according to claim 5 wherein the fluorinated gas comprises one or more of $CF_4$, $SF_6$ and $NF_3$.

7. A method according to claim 5 wherein the second cleaning gas comprises an oxygen containing gas.

8. A method according to claim 7 wherein the oxygen containing gas consists essentially of oxygen.

9. A method according to claim 5 wherein the substrate etching gas comprises a gas capable of etching a tungsten silicide layer on the substrate.

10. A method according to claim 5 wherein the substrate etching gas comprises one or more of $Cl_2$, $N_2$, $O_2$, HBr and He—$O_2$.

11. A method according to claim 5 wherein the volumetric flow ratio of substrate etching gas to first cleaning gas is from about 1:1 to about 20:1.

12. A method according to claim 5 wherein the energized second process gas is provided in the chamber while the substrate is in the chamber.

13. A method according to claim 5 wherein in the third stage, the chamber pressure is maintained at from about 1 mTorr to about 10 mTorr.

14. A method according to claim 5 wherein in the third stage, the ratio of source power to bias power is from about 5:3 to about 40:1.

15. A method of etching a substrate in a chamber and cleaning etchant residue from surfaces in the chamber, the method comprising the steps of:
   (a) electrostatically holding the substrate in the chamber;
   (b) providing an energized first gas in the chamber, the energized first gas being capable of etching a first material on the substrate thereby depositing a first etchant residue on the surfaces in the chamber;
   (c) after (b), providing an energized second gas comprising a fluorinated cleaning gas in the chamber, the energized second gas being capable of etching a second material on the substrate while suppressing deposition of a second etchant residue onto the first etchant residue, the first etchant residue being compositionally different from the second etchant residue; and
   (d) after (c), providing a cleaning gas comprising an oxygen containing gas in the chamber and coupling RF power to energize the cleaning gas to clean the first and second etchant residue deposits formed on the surfaces in the chamber and simultaneously remove residual charge accumulated in the substrate.

16. A method according to claim 15 wherein the fluorinated cleaning gas comprises one or more of $CF_4$, $SF_6$ and $NF_3$.

17. A method according to claim 15 wherein the oxygen containing gas consists essentially of oxygen.

18. A method according to claim 15 wherein the substrate comprises a metal silicide layer, and wherein (c) comprises providing the energized second gas comprising the fluorinated cleaning gas to etch the metal silicide layer.

19. A method of etching a substrate comprising a metal silicide containing layer in a chamber and at least partially removing etchant residue from surfaces in the chamber, the method comprising the steps of:
   (a) electrostatically holding the substrate comprising the metal silicide containing layer in the chamber;
   (b) providing a firs energized gas comprising a fluorinated gas in the chamber, the first energized gas comprising an etchant gas to etch the metal silicide containing layer on the substrate; and
   (c) providing a second gas in the chamber and energizing the second gas by coupling RF power to the second gas to at least partially remove etchant residue from the surfaces in the chamber and simultaneously remove residual charge accumulated in the substrate.

20. A method according to claim 19 wherein the fluorinated gas comprises one or more of $CF_4$, $SF_6$ and $NF_3$.

21. A method according to claim 19 wherein the second energized gas comprises an oxygen containing gas.

22. A method according to claim 21 wherein the oxygen containing gas consists essentially of oxygen.

23. A method according to claim 19 wherein the etchant gas comprises a gas capable of etching a tungsten silicide layer on the substrate.

24. A method according to claim 19 wherein the etchant gas comprises one or more of $Cl_2$, $N_2$, $O_2$, HBr and He—$O_2$.

25. A method according to claim 19 wherein the fluorinated gas comprises a fluorinated cleaning gas, and wherein a volumetric flow ratio of etchant gas to fluorinated cleaning gas is from about 1:1 to about 20:1.

26. A method of etching a substrate in a chamber and cleaning residue that forms on surfaces in the chamber, the method comprising the steps of:
   (a) placing the substrate in the chamber and electrostatically holding the substrate on an electrostatic chuck;
   (b) in an etching stage, etching one or more materials on the substrate using energized gas, at least one composition of the energized gas including an etching gas comprising one or more of $Cl_2$, $N_2$, $O_2$, HBr and He—$O_2$; and a residue cleaning gas comprising one or more of $CF_4$, $SF_6$ and $NF_3$; and
   (c) cleaning the residue formed on the surfaces in the chamber and assisting in dechucking the substrate from the electrostatic chuck using another energized gas comprising oxygen.

27. A method according to claim 26 wherein the volumetric flow ration of etching gas to residue cleaning gas is from about 1:1 to about 20:1.

28. A method of etching a substrate in a chamber and cleaning residue formed on surfaces in the chamber, the chamber comprising an electrostatic chuck, and the method comprising the steps of:
   (a) transferring a substrate into the chamber and electrostatically holding the substrate on the electrostatic chuck, the substrate comprising a mask layer;
   (b) providing an energized gas in the chamber to etch the mask layer on the substrate thereby forming residue on the surfaces in the chamber, the residue comprising species originating from the mask layer;
   (c) providing another energized gas in the chamber to etch material below the mask layer, the energized gas comprising etching gas and residue cleaning gas, the etching gas comprising one or more of $Cl_2$, $N_2$, $O_2$, HBr, and He—$O_2$ and the residue cleaning gas comprising one or more of $CF_4$, $SF_6$, and $NF_3$; and
   (d) providing an oxygen containing plasma in the chamber to assist in dechucking the substrate and to clean the residue formed on the surfaces in the chamber.

29. A method according to claim 28 wherein the volumetric flow ratio of etching gas to residue cleaning gas is from about 1:1 to about 20:1.

30. A method of cleaning a chamber to remove residue from surfaces of a ceiling portion in the chamber, the chamber having an antenna adjacent to the ceiling portion, and the method comprising the steps of:
   (a) providing an energized process gas in the chamber to clean the surfaces in the chamber, the process gas consisting essentially of oxygen; and
   (b) setting a chamber source power level applied to the antenna to remove residue from the surfaces of the ceiling portion.

31. A method according to claim 30 wherein step (b) comprises increasing the chamber source power to increase the amount of residue removed from the surfaces.

32. A method according to claim 30 wherein (b) comprises setting a chamber source power level applied to the antenna of about 500 Watts.

33. A method of etching a substrate in a chamber and at least partially removing etchant residue from surfaces in the chamber, the method comprising:
   (a) supporting the substrate in the chamber, the substrate having a metal silicide containing layer thereon;
   (b) providing an energized gas in the chamber to etch through the metal silicide containing layer, the energized gas comprising a fluorinated gas;
   (c) after (b), providing an energized gas consisting essentially of $O_2$ in the chamber to at least partially remove etchant residue from the surfaces in the chamber and to remove residual charge accumulated in the substrate; and
   (d) after (c), removing the substrate from the chamber.

34. A method according to claim 33 wherein (b) comprises providing an energized gas comprising an etchant gas comprising one or more of $Cl_2$, $N_2$, $O_2$, HBr, and He—$O_2$.

35. A method according to claim 33 wherein (b) comprises providing a fluorinated gas comprising one or more of $CF_4$, $SF_6$, and $NF_3$.

36. A method of etching a substance in a chamber and at least partially removing etchant residue from surfaces in the chamber, the method comprising:
   (a) electrostatically holding the substrate in the chamber, the substrate having a first and a second layer thereon, the second layer comprising a metal silicide layer;
   (b) providing a first energized gas in the chamber to etch the first layer;
   (c) providing a second energized gas in the chamber to etch the second layer and at least partially remove the etchant residue formed on the surface in the chamber in (b); and
   (d) providing an energized cleaning gas to at least partially remove residues formed on surfaces in the chamber in (b) and (c) and simultaneously remove residual charge accumulated in the substrate.

37. A method according to claim 36 wherein the second energized gas comprises carbon and fluorine species.

38. A method according to claim 36 wherein the second energized gas comprises sulfur and fluorine species.

39. A method according to claim 36 wherein the second energized gas comprises nitrogen and fluorine species.

40. A method according to claim 36 wherein (c) comprises providing a second energized gas comprising a fluorinated gas.

* * * * *